United States Patent [19]

Bertin et al.

[11] Patent Number: 4,603,341
[45] Date of Patent: Jul. 29, 1986

[54] STACKED DOUBLE DENSE READ ONLY MEMORY

[75] Inventors: Claude L. Bertin, South Burlington; Howard L. Kalter, Colchester, both of Vt.

[73] Assignee: International Business Machines Corporation, Armonk, N.Y.

[21] Appl. No.: 530,452

[22] Filed: Sep. 8, 1983

[51] Int. Cl.⁴ .................. H01L 29/78; G11C 17/00
[52] U.S. Cl. ................................. 357/23.7; 357/41; 357/45; 357/59; 365/104
[58] Field of Search .............. 357/23 R, 23 MG, 41, 357/45, 46; 365/103–105, 174, 182; 357/59, 45, 4, 23.7, 41

[56] References Cited

U.S. PATENT DOCUMENTS 4,208,727  6/1980  Redwine et al. .................. 357/45
4,240,097  12/1980  Raymond, Jr. ..................... 357/68
4,272,880  6/1981  Pashley ............................. 357/42

Primary Examiner—Andrew J. James
Assistant Examiner—Mark Prenty
Attorney, Agent, or Firm—Sughrue, Mion, Zinn, Macpeak and Seas

[57] ABSTRACT

A read only memory array of stacked IGFET devices composed of first and second sub-arrays of field effect transistors. The first sub-array of first field effect transistors is formed in a substrate. Each of the first field effect transistor devices is responsive to a polysilicon gate electrode. The second sub-array of second field effect transistors is formed in a layer of laser annealed polysilicon material which overlies the first sub-array. The gate electrodes of the first field effect transistors act as the gate electrodes of the second field effect transistors.

5 Claims, 10 Drawing Figures

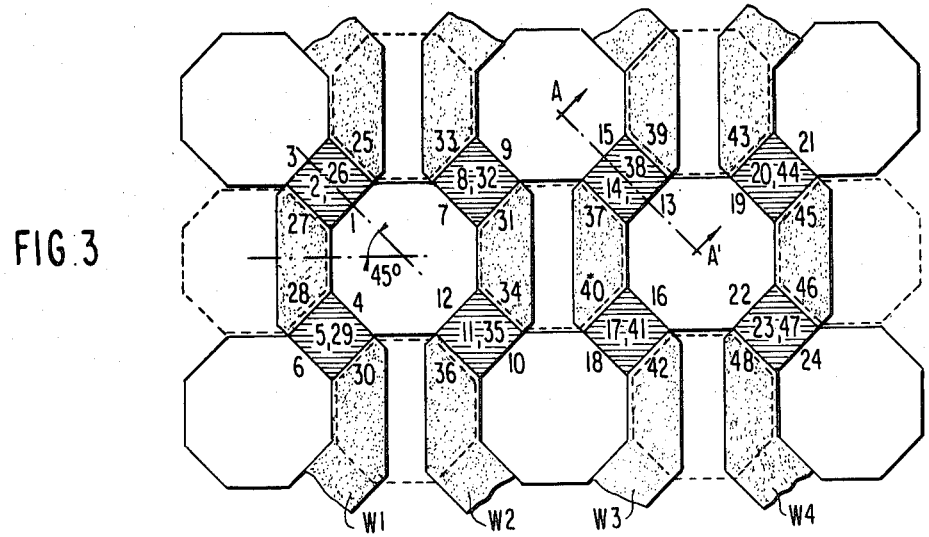

STACKED DOUBLE DENSE READ ONLY MEMORY

FIELD OF THE INVENTION

The invention is in the field of memory arrays and particularly read only memory (ROM) arrays using field effect transistors.

BACKGROUND OF THE INVENTION

Read only memories including those in which memory elements are field effect transistors (FET) are well known and have extensive application in state of the art digital electronic systems. The ROM is a particularly attractive device for storing fixed program instructions and other information which need not be changed during computer operations. It is a continuing goal of the semiconductor industry to increase ROM density thereby permitting either more compact ROMs or ROMs with larger memory capacity.

Many different approaches for producing high density integrated circuits have been investigated. For example, U.S. Pat. No. 4,208,727 which issued June 17, 1980 to Redwine et al. discusses attempts to increase ROM density by using MOS diodes constructed of programmed N channel field effect transistors. Diode-like cells are produced by shorting the gates to the drains of the FET memory elements. Memory arrays such as the Redwine, et al. array have their density limited by the limits set on the length and width of the ROM array.

It is generally known in the semiconductor industry to provide high density circuits by using what is termed multilayer integrated circuit processing in which, for example, two or three layers of polycrystalline silicon, often referred to as polysilicon, are used to increase circuit density. In U.S. Pat. No. 4,272,880 which issued June 16, 1981 to Pashley, an inverter circuit is fabricated using multilayer integrated circuit processing. Another multilayer arrangement is illustrated in U.S. Pat. No. 4,240,097 which issued Dec. 16, 1980 to Raymond, Jr.

SUMMARY OF THE INVENTION

It is an object of the invention to apply multilayer integrated circuit processing to read only memory arrays.

It is a further object of the invention to fabricate a stacked double dense read only memory array with first level and second level field effect transistor devices which share a common gate.

These and other objects which will become apparent from the following detailed description of the invention are realized by fabricating first and second levels of field effect transistor memory arrays, the first level array being formed in the substrate, the second level array in a layer of laser annealed polysilicon. Another polysilicon layer forms a common gate shared by a first level FET and a second level FET device. The first level polysilicon is extended to form common word lines for both first and second level memory elements. Sense lines and select lines can be formed either on the surface of the double stacked array or buried. The sense and select lines, like the word lines may be common to both first and second level arrays. Techniques for personalizing the double stacked ROM array are also disclosed.

BRIEF DESCRIPTION OF THE DRAWINGS

FIG. 3 is a plan view of the layout of the double stacked field effect transistor memory arrays according to the teachings of the invention.

FIG. 4a is a cross-sectional view taken along the section line A-A' of FIG. 3 and shows a partially fabricated double stacked array.

FIG. 4b is a cross-sectional view along the section lines A-A' of FIG. 3 showing the double stacked array during later stages of the fabrication process.

FIG. 4c is a cross-sectional view along the section line A-A' of FIG. 3 and shows the completed double stacked array.

DETAILED DESCRIPTION OF THE PREFERRED EMBODIMENT

Figure 1:
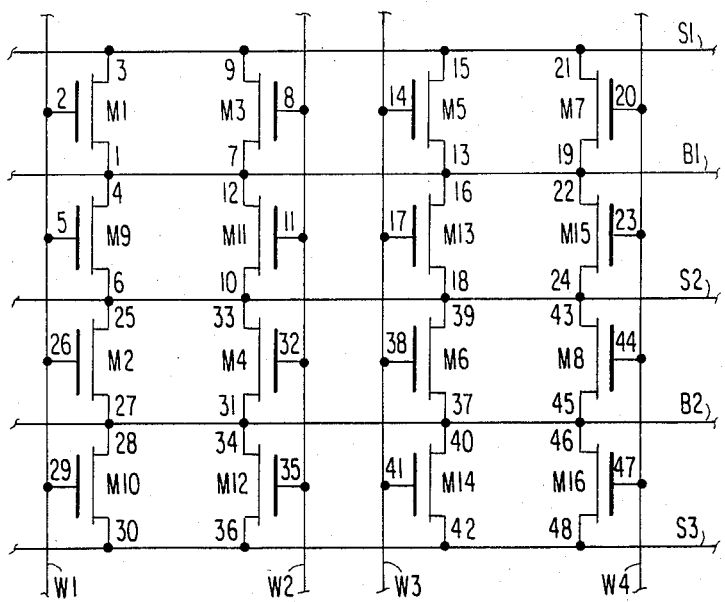
FIG. 1 is a schematic diagram of a prior art FET read only memory.

FIG. 1 is a schematic diagram of a portion of a conventional ROM array of FET memory elements. The array is constituted of a plurality of word lines, W1-W4, sometimes referred to as row lines, which intersect sense lines, S1-S3, and select lines B1 and B2, both of which are sometimes referred to as column lines. The sense and select lines are shown generally orthogonal to the word lines to form a rectangular array with FET memory elements located at the intersection of a word line with a select line and a sense line. As is well known to those skilled in the art, word lines are not necessarily orthogonal to sense and select lines. They are illustrated in the manner shown in FIG. 1 to facilitate the explanation of the ROM. The memory elements connected to select line B1 are labeled with odd numbered designators M1-M15. Memory elements connected to the select line B2 are labeled with even numbered designators M2-M16. These designations are used to help explain a feature of the invention as will become apparent as the preferred embodiment of the invention is explained in detail hereinafter.

Each memory element is a field effect transistor, comprised of a source region and drain region, with a channel region therebetween, and a gate located over the channel region but insulated therefrom by suitable dielectric material. For example, the memory device M1 is composed of a source 1, drain 3 and gate 2. As is known by those skilled in the art, source and drain regions in an FET are interchangeable. The nomenclature used for these diffused regions is dependent on the direction of current flow, with current flowing from the drain to the source region. It is assumed that current will flow in the memory device of FIG. 1 from a sense line to a select line. Thus, the device region connected to a sense line is termed herein the drain region and the device region connected to a select line, the source region. Thus, when the memory device M1 is selected by the application of appropriate potentials to word line W1 and select line B1, the device M1 conducts from the drain 3 through the channel and the source 1, to the select line B1. The operation of each of the other memory devices M3-M15 and M2-M16 is the same as described with respect to the device M1.

For purposes of explanation, the FET device comprising the memory elements of FIG. 1 will be N channel devices and in the description of the invention which follows, all references to FET memory devices will be to N channel devices. However, as will be apparent to those skilled in the art, the invention is not limited to N channel devices, it being equally applicable to P channel devices.

Personalization of the FIG. 1 array can be effected in any of a number of conventional ways. For example, as described in the aforementioned U.S. Patent to Redwine, et al., personalization can be effected with enhancement devices by doping the channels of selected devices with boron to raise the channel threshold beyond $V_{DD}$. Thus, with $V_{DD}$ at 5 volts, boron is ion diffused into the channels of selected devices to raise their channel threshold voltage to above 5 volts. Those FETs not doped with boron are provided with a conventional 0.8 volts threshold. The application of a suitable gate voltage will raise the channel potential of the non-boron doped FETs beyond their threshold and conduction will take place. However, those FETs doped with boron will not conduct on application of the same gate voltage by reason of the increased threshold voltage. Of course, other techniques including selective omission of devices may also be used to personalize the ROM array.

Figure 2:
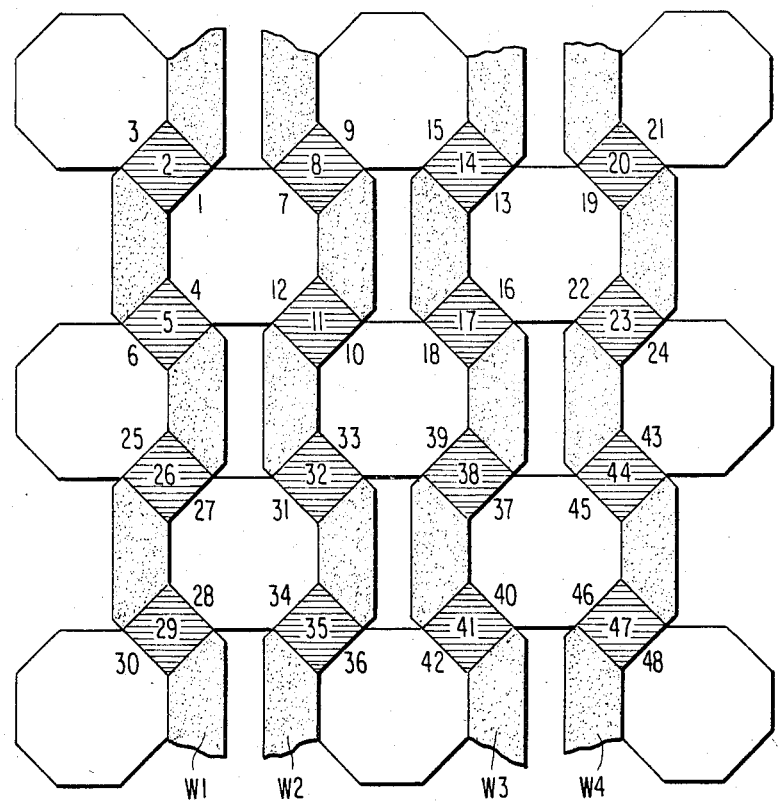
FIG. 2 is a plan view of the layout of the prior art FET memory shown schematically in FIG. 1.

FIG. 2 illustrates a plan view of the layout for the array shown schematically in FIG. 1. In FIGS. 1 and 2, like parts of the memory carry common numerical designations. Thus, the source 1 of the device M1 is shown as being connected to a node common to source 7 of device M3, source 4 of device M9 and source 12 of device M11 in both FIGS. 1 and 2. The word lines W1-W4 form the gates as shown. Word line W1 forms gates 2, 5, 26 and 29. Similarly, word line W2 forms gates 8, 11, 32 and 35. Not shown in FIG. 2 are the select and sense lines which may be located on or within the array in a conventional manner. This array has its density limited by the constraints placed on its length and width.

According to the teachings of this invention, array density is greatly increased by forming a double stacked array. For the purposes of illustration, the double stacked array will be described with reference to the devices shown in FIGS. 1 and 2. That is, the double stacked array will be described as being composed of a first level of memory elements consisting of the odd numbered devices M1-M15 of FIGS. 1 and 2 and a second level of memory elements consisting of the even numbered devices M2-M16. Of course, the invention is not so limited, and applies equally to the fabrication of a second level array, which may be termed M'1-M'n, above a first level array of devices M1-Mn, where n is an integer.

Referring to FIG. 3, which illustrates a plan view of the layout of the double stacked memory array of the invention, the ROM is comprised of a first level of devices shown in solid lines and a second level of devices shown in dotted lines. It is to be understood that the first and second levels are in different planes. To help maximize density, the second level devices are located at 45° relative to first level devices although this angle is not a requirement. The relationship is illustrated in FIG. 3 by the 45° angle drawn between the first level device M1 consisting of source region 1, drain 3 and gate 2 and the second level device M2 consisting of the source 27, drain 25 and gate 26. As is apparent from FIG. 3, these devices share a common gate 2, 26 formed in word line W1. Since the devices at different levels are at 45° relative to each other, the current direction in level one is 90° with respect to that of level two devices. This helps distinguish level one current from level two current. It should also be noted from FIG. 3 that common source and drain diffusions also assist in increasing array density. For example, a single diffusion defines the sources 1, 4, 7 and 12 of devices M1, M3, M9 and M11. Likewise, a common drain diffusion defines the sources 9 and 15 of the memory devices M3 and M5.

Fabrication of the array will now be described with reference to FIGS. 4a through 4c. These figures show the cross-section of the array taken along section line A-A' of FIG. 3, at various stages in the fabrication process. As the array is fabricated using conventional semiconductor integrated circuit processing techniques, the specific steps used will be summarized. FIG. 4a shows a cross-section of a lower level device of the double stacked array. The device is built as follows. In a P substrate for N channel devices, device areas are first defined using standard techniques. Thereafter, a gate oxide 200 is thermally grown to a thickness of between 25-50 ηm. The next step in the processing will be dictated by the personalization concept employed. One personalization scheme according to the invention involves leaving some array devices enhancement mode at low threshold voltage and others enhancement mode at high threshold voltage to thereby program the array into logic 1 and logic 0 locations. When this personalization scheme is used, the processing sequence for forming the lower array continues with the following steps. All array devices are left doped with a P-type dopant, such as boron, using standard ion implantation techniques. This produces enhancement mode devices of relatively low threshold voltage, 0.8 V for example. Then a layer of phosphorus doped polysilicon is deposited. Using conventional photo-resist and masking techniques, the device gate area 14 and word line pattern (not shown) are defined. The pattern is then etched to form polysilicon word lines and the gate region 14. Source and drain diffusions 13, 15 are next diffused by ion implantation with arsenic. Previously formed gate 14 permits self-alignment of the source and drain regions. Silicon dioxide 207 is now thermally grown over the source, drain and gate areas to a thickness of approximately 35 to 60 ηm. At this point in the processing, selected devices will next undergo a change from low threshold enhancement devices to high threshold enhancement device. To accomplish this, a photoresist 208 is applied as a blockout mask, to mask out certain devices. The mask is defined such that the channel areas of those devices which are to undergo mode change are left unblocked. Next, the array is subjected to high energy implantation of boron. Boron thus diffuses through the gate 14 of exposed devices to their channels. This step changes non-blocked devices from low threshold enhancement devices to high threshold enhancement devices. While not shown, a direct contact etch forms a hole which will permit second level polysilicon, the formation of which is explained hereinafter, to contact some N+ diffusions to form the array select lines.

The formation of the second level array devices will now be described with reference to FIG. 4b. It should be remembered that second level devices are preferably located 45° relative to first level devices to situate the channels of the second level devices at 90° relative to the channels of the first level devices. Therefore, FIG. 4b shows the length of the channel between the source and drain diffusions 13, 15 of the first level device, while only the width of the channel of the second level device is shown, its source and drain regions not being visible in the drawing.

To form the upper level array devices, the photoresist 208 is removed and a second layer of polysilicon 210 is deposited to a thickness of approximately 500 to 1000 $\eta$m. This film is lightly doped to form a 2-10 ohms per square P-type layer. The polysilicon layer 210 is laser annealed in a known manner to form large or single crystalline material. The second FET will be formed in the second level polysilicon. Using standard techniques, N+ regions, not shown in FIG. 4b, are diffused in the laser annealed second level polysilicon layer 210 to form source and drain regions. As should be obvious to those skilled in the art, the array pattern in the second level polysilicon layer is determined and defined using appropriate photoresist and masking techniques.

P-type polysilicon material produces enhancement devices throughout the second level array. Personalization may follow by using a blockout mask to select exposed devices which are to undergo mode change. The array now undergoes ion implantation with boron to produce high threshold enhancement devices at unmasked locations. This personalizes the upper array into logic 1 and logic 0 locations.

Once personalized, a CVD oxide of approximately 500 $\eta$m is deposited and after defining the select line pattern (not shown) by suitable photoresist and masking techniques, it is etched to form the select line regions. In the preferred embodiment, select lines are formed using silicide. The silicide regions are formed by depositing a film of tungsten, or other suitable material, on exposed second level polysilicon (exposed as a result of the aforementioned etching process) to produce conductive regions of 2-4 ohms per square after annealing. An additional CVD oxide of approximately 500 $\eta$m is then deposited to insulate the silicide regions.

Completion of the double stacked array will now be described with reference to FIG. 4c. It should be noted that FIG. 4c does not illustrate the silicide select lines. They have been omitted to facilitate the explanation of the invention. The preferred arrangement of the select lines of silicided regions will be explained hereinafter with reference to FIGS. 5 and 6. Referencing once again FIG. 4c, a directional contact etch is now used to open a hole to N+ diffusions forming the drains of the level one devices situated in the wafer substrate. In addition, a hole not shown in FIG. 4c is also opened to the N+ diffusions forming the drain regions in the top annealed polysilicon. Metal such as aluminum is deposited to form metal sense lines contacting these N+ drain regions. Passivation 214 is deposited over the entire double stacked array and selectively etched to provide via holes for contacts. The chip is now finished.

It should be noted that the described NMOS array can be made compatible with standard CMOS peripheral devices including stacked CMOS devices. The peripheral devices can be formed on the chip by defining the peripheral region, and N background doping the second level polysilicon layer in the peripheral region to form P channel devices, thus forming stacked CMOS circuits. Thus, the word lines, W1-W4 formed in the first level polysilicon can be driven from CMOS FET devices whose source-drains can be connected to the level one polysilicon via buried contacts or through metal. If buried contacts are required by the peripheral circuits, they would be formed immediately after gate oxide 200 is grown. It is also noted that the first level polysilicon layer may be laser annealed prior to the growth of the second gate region 207. This would reduce surface spikes prior to thermal growth.

Figure 5:
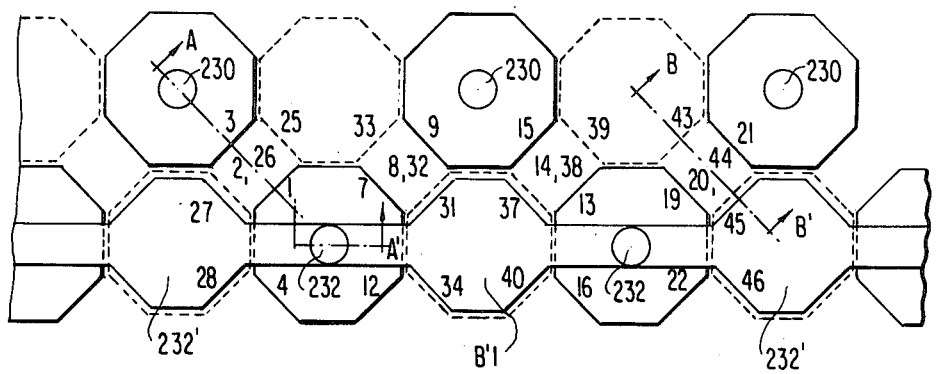
FIG. 5 is a plan view of the layout of the double stacked array according to the teachings of the invention and illustrates the select lines formed in the second level polysilicon film using silicide.
Figure 6A:
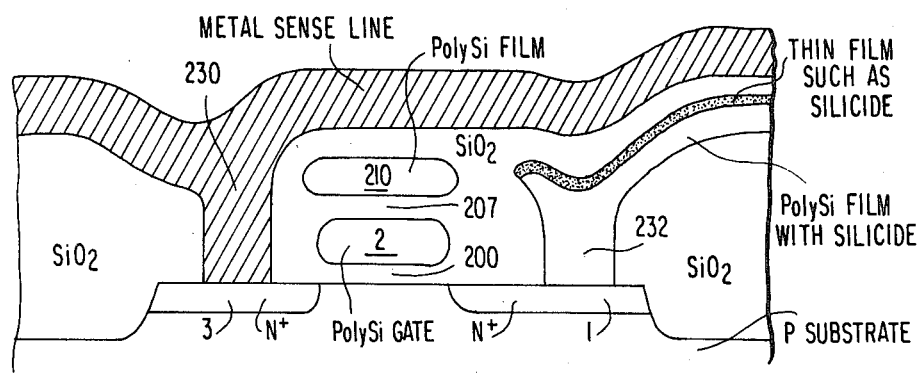
FIG. 6a is a cross-sectional view along the section line A-A' of FIG. 5.
Figure 6B:
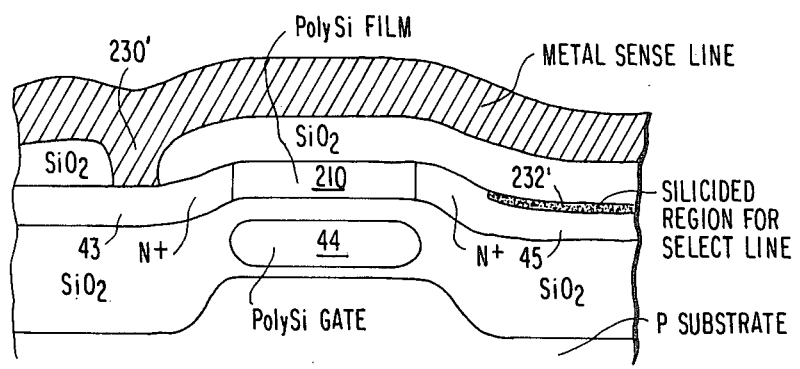
FIG. 6b is a cross-sectional view along the section line B-B' of FIG. 5.

FIG. 5 illustrates a plan view of the double stacked array with the silicided second level polysilicon region forming select lines exposed for the purposes of explanation. It should be noted that upon stacking the array, illustrated in FIG. 1, a single select line B'1 replaces the two select lines B1 and B2. FIGS. 6a and 6b are cross-sections of the portion of the double stacked array illustrated in FIG. 5 taken along section line A-A' and line B-B', respectively. FIG. 5 does not illustrate the metal sense lines for electrical connection to the drain diffusions. Contact regions 230 are formed in the manner explained previously herein with regard to FIGS. 4a-4c to provide contact between the N+ drain diffusions and a metal sense line. They are formed by etching a hole through the silicon dioxide at locations over the drain diffusions and thereafter filling the holes with metal as the select lines are formed. The silicided second level polysilicon forming a select line contacts the source regions of both first and second level devices. Thus, select line B'1 contacts at 232'N+ diffusion in the second level polysilicon film at the source regions which include sources 27 and 28 of devices M2 and M12, respectively. The select B'1 further contacts the N+ regions within the second level polysilicon film forming the sources for devices M4, M6, M12 and M14. Also contacted by the silicided second level polysilicon is the source region which forms the sources for devices M8 and M16. Regions 232 illustrate contact regions for contacting the silicided second level polysilicon select lines to the source diffusions forming the sources of devices in the first level array formed in the substrate.

Referring now to FIG. 6a, it can be seen that the contact region 232 for connecting the select line to the N+ source region 1 of the first level array devices may be formed by etching a hole through the silicon dioxide. More specifically, and as mentioned previously herein, the silicided regions are formed by etching the CVD oxide to define the desired regions for silicide. The regions over the N+ source areas 1 are etched to the source regions and the holes thus created filled with silicided polysilicon with a surface of thin film silicide. As illustrated in FIG. 6b the silicide region for the select line to the N+ source regions of the second level devices is deposited after the etching of the CVD oxide.

Figure 7:
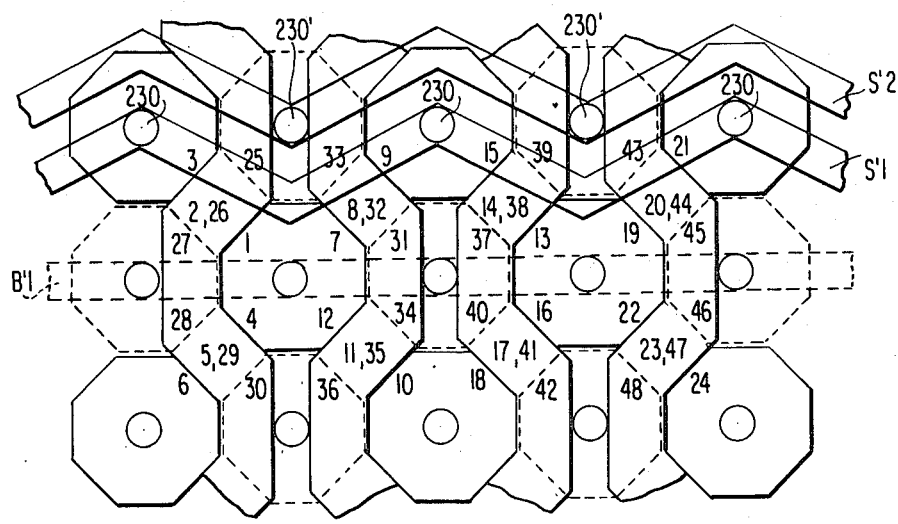
FIG. 7 is a plan view of the layout of the double stacked memory array of the invention showing one layout arrangement of the sense lines.

FIG. 7 illustrates one arrangement of the sense lines for contacting the drain diffusions of both the first and second level array devices. Sense lines S'1 and S'2 correspond to the metal sense lines illustrated in FIGS. 4c and 6a and 6b. Like parts in FIGS. 6a and 6b and the preceding figures are designated with common numerical designations. Thus, sense line S'1 is shown to zig-zag across the surface of the array and contact the lower level devices M1-M15 at the contact regions 230. As will be recalled, in the preferred embodiment, a hole is etched at each drain region to permit the metal to directly contact the drain diffusion. As can be seen from FIG. 6a, the contact region 230 descends from the top surface of the device below the passivation through the silicon dioxide to the N+ source region 3. As seen in FIG. 6b, the contact region 230' contacts the N+ drain region in the polysilicon film to connect the second level array devices to the sense line.

While this invention has been described with reference to illustrative embodiments, the description is not intended to be construed in a limiting sense. Various modifications of the embodiments set forth herein as well as other embodiments of the invention will be apparent to those skilled in the art upon reference to this description. It is therefore contemplated that the claims will cover any such modifications or embodiments as fall in the true scope of the invention.

We claim:

1. An array of field effect devices including a first sub-array of interconnected first field effect devices having source and drain regions formed in a semiconductor substrate, each of the first field effect devices being responsive to a gate electrode, and a second sub-array including a plurality of interconnected second field effect devices having source and drain regions formed in a layer of semiconductor material overlying the first sub-array, the gate electrodes of the first field effect devices acting as the gate electrodes of the second field effect devices, wherein selected ones of said first and second field effect devices are enhancement mode devices of low threshold, the remaining ones of said first and second field effect devices being enhancement mode devices of high threshold.

2. In the array of field effect devices as claimed in claim 9, wherein said layer of semiconductor material overlying the first sub-array is laser annealed polycrystalline silicon.

3. An array of field effect devices including a first sub-array of interconnected first field effect devices having source and drain regions formed in a semiconductor substrate, each of the first field effect devices being responsive to a gate electrode of polycrystalline silicon, a second sub-array including a plurality of interconnected second field effect devices having source and drain regions formed in a layer of semiconductor material overlying the first sub-array, the gate electrodes of the first field effect devices acting as the gate electrodes of the second field effect devices, at least one word line of polycrystalline silicon integrally formed with a plurality of said gate electrodes.

4. In the array of field effect devices as claimed in claim 11, wherein said layer of semiconductor material overlying the first sub-array is laser annealed polycrystalline silicon.

5. In the array of field effect devices as claimed in claim 3, further including at least one select line connected to source regions of a plurality of said first and second field effect devices, said select line being silicided polycrystalline silicon within the said layer of semiconductor material.

* * * * *